US012682267B2

(12) United States Patent
Pérez López et al.

(10) Patent No.: US 12,682,267 B2
(45) Date of Patent: Jul. 14, 2026

(54) INTEGRATED PHOTONIC DEVICE COMPRISING A FIELD-PROGRAMMABLE PHOTONIC GATE ARRAY, A QUANTUM DEVICE AND PROGRAMMABLE CIRCUITS

(71) Applicant: UNIVERSITAT POLITECNICA DE VALENCIA, Valencia (ES)

(72) Inventors: Daniel Pérez López, Valencia (ES); José Capmany Francoy, Valencia (ES)

(73) Assignee: UNIVERSITAT POLITECNICA DE VALENCIA, Valencia (ES)

( * ) Notice: Subject to any disclaimer, the term of this patent is extended or adjusted under 35 U.S.C. 154(b) by 779 days.

(21) Appl. No.: 17/785,294

(22) PCT Filed: Oct. 30, 2020

(86) PCT No.: PCT/ES2020/070671
§ 371 (c)(1),
(2) Date: Jun. 14, 2022

(87) PCT Pub. No.: WO2021/123470
PCT Pub. Date: Jun. 24, 2021

(65) Prior Publication Data
US 2023/0029063 A1     Jan. 26, 2023

(30) Foreign Application Priority Data

Dec. 18, 2019     (ES) ............................... ES201931123

(51) Int. Cl.
*G06F 30/30*          (2020.01)
*G06N 10/40*          (2022.01)
*H03K 19/17728*       (2020.01)

(52) U.S. Cl.
CPC ....... *G06N 10/40* (2022.01); *H03K 19/17728* (2013.01)

(58) Field of Classification Search
CPC .. G06N 10/40; H03K 19/17728; H03K 19/14; G02B 6/43
See application file for complete search history.

(56) References Cited

U.S. PATENT DOCUMENTS 6,701,504 B2 * 3/2004 Chang ..................... G06F 30/30
                                                    716/139
9,354,039 B2 * 5/2016 Mower .................. B82Y 20/00
            (Continued)

FOREIGN PATENT DOCUMENTS

ES        2695323 A1     1/2019
ES        2730448 A1     11/2019
            (Continued)

OTHER PUBLICATIONS

Daniel Petez, "Field-programmable photonic arrays", Journal, 2018, 1-14, vol. 26, No. 21, Optics Express.
            (Continued)

*Primary Examiner* — Jack Chiang
*Assistant Examiner* — Brandon Bowers
(74) *Attorney, Agent, or Firm* — Hayes Soloway PC

(57)          ABSTRACT

The present invention relates to an integrated photonic and quantum system carried out by the combination and interconnection of Programmable Photonics Processing Blocks, implemented over a photonic chip that is capable of implementing one or multiple, simultaneous quantum and classical circuits with optical feedback paths and/or linear multiport transformations, by the appropriate programming of its resources and the selection of its input and output ports. The invention also relates to a quantum field-programmable photonic gate array (Q-FPPGA) comprising at least one programmable circuit based on tunable beam-splitters with independent coupling and phase-shifting configuration and
            (Continued)

peripheral high-performance building blocks enabling clas-
sical and quantum operations.

19 Claims, 13 Drawing Sheets

(56) References Cited

U.S. PATENT DOCUMENTS

| | | | |
|---|---|---|---|
| 10,133,986 B1 * | 11/2018 | Newton ................ | G06N 10/40 |
| 11,073,658 B2 | 7/2021 | Perez Lopez | |
| 2015/0354938 A1 | 12/2015 | Mower et al. | |
| 2017/0248760 A1 * | 8/2017 | Hu ..................... | G02B 6/12007 |
| 2023/0077665 A1 * | 3/2023 | Kuttimalai ......... | G06F 3/04847 |
| | | | 700/90 |
| 2025/0095793 A1 * | 3/2025 | Yamazaki ............. | G16B 20/30 |

FOREIGN PATENT DOCUMENTS

| | | |
|---|---|---|
| JP | 2020106747 A | 7/2020 |
| WO | 2004053544 A2 | 6/2004 |

OTHER PUBLICATIONS

Jose Capmany, "Reversible Gates for Programmable Photonics",
Abstract, 2019, 1-2, IEEE Photonics Society Summer Topical
Meeting Series.
Fabio Antonio Bovino, "Intrasystem Entanglement Generator and
Unambiguos Bell States Discriminator on Chip", Article, 2019,
7993-7997, 2019 IEEE International Conference on Acoustics,
Speech and Signal Processing.

* cited by examiner

Port Number $C_i$ Connection number (d)

(e)

p  Port Number c  Connection number

FIG. 3

Example 1: Heralded CNOT Quantum Gate implementation

FIG. 6

*Example 3: Simultaneous quantum circuits (Rotation cascade and Hadamard Gate)*

INTEGRATED PHOTONIC DEVICE COMPRISING A FIELD-PROGRAMMABLE PHOTONIC GATE ARRAY, A QUANTUM DEVICE AND PROGRAMMABLE CIRCUITS

CROSS-REFERENCE TO RELATED APPLICATIONS AND PRIORITY

This patent application claims priority from PCT Application No. PCT/ES2020/070671 filed Oct. 30, 2020, which claims priority from Spanish Patent Application No. P201931123 filed Dec. 18, 2019. Each of these patent applications are herein incorporated by reference in their entirety.

OBJECT OF THE INVENTION

The present invention relates to an integrated photonic and quantum system carried out by the combination and interconnection of Programmable Photonics Processing Blocks, implemented over a photonic circuit that is capable of implementing one or multiple quantum and classical circuits with optical feedback paths and/or linear multiport transformations, by the programming of its resources and the selection of its input and output ports. The invention also relates to a quantum field-programmable photonic gate array (Q-FPPGA) comprising at least one programmable circuit based on tunable beam-splitters with independent phase tuning and peripheral high-performance building blocks enabling classical and quantum operations.

BACKGROUND OF THE INVENTION

Programmable multifunctional photonics (PMP) seeks to design configurations of integrated optical hardware that can implement a wide variety of applications and functionalities by means of the suitable programming of its components. Various authors have covered theoretical works proposing different configurations and design principles for programmable circuits based on cascade beam splitters or Mach-Zehnder interferometers (MZIs). These proposals offer versatile hardware solutions to implement programmable circuits, however they do not define a complete architectonic solution for a photonic device that can be programmed to implement simple, complex or even arbitrary circuits alone or simultaneously. Only very recent patents (U.S. Ser. No. 16/235,056, JP2018-247546, P201930410, P201831118) have been proposed considering the aforementioned details, resulting in the definition of field-programmable photonic array (FPGA).

Additionally, it has been proved that the combination of basic optical processing units with the capability of programming/tuning/selecting the beam splitting ratio between their output ports and the phase tuning has led to waveguide mesh elements with different mesh topologies and groundbreaking versatility in regard to their functionality. In particular, some of the proposed architectures enable feedback-loops of the optical signal inside the mesh, allowing the formation of optical cavities, Sagnac-type loops and more complex circuits. In addition, a very recent patent application (P201930410) also describes a technical improvement of waveguide meshes based on the combination of tunable basic units (TBUs) that have the same spatial/angular orientation. This means that the longitudinal axes of the TBUs are parallel to each other. This technical advantage results in the mitigation of manufacturing defects and improves performance and the scalability of the manufactured circuits.

In parallel, various authors have published integrated circuits that perform linear transformations of the guided modes at the input of a waveguide mesh. The proposed architectures require the combination and fixed interconnection of beam splitters and phase actuators. Some publications employ these circuits to perform a limited set of operations that are used for quantum signal processing, most notably in the creation of transformation arrays they describe the operation between input and output modes.

DESCRIPTION OF THE INVENTION

The object of the invention described here solves the problems set out above and allows the design of programmable quantum and classical signal processing systems where all the mentioned components are connected to a reconfigurable optical core that allows the implementation of reconfigurable linear transformations, the signal conditioning and the dynamic interconnection between classical high-performance processing blocks, quantum high-performance processing blocks, chip-to-chip couplers and chip-fiber couplers.

The object of the invention is based on the repetition, replication and interconnection of programmable photonic analog units and reconfigurable interconnections preferably implemented in a photonic chip. These components provide the basic building blocks to implement basic optical analog signal operations (reconfigurable optical power and energy division as well as independent phase configuration) and, by extension, reconfigurable 2×2 rotation arrays or gates. In a very broad sense, it can be considered that the processing performed is reconfigurable, in the same manner that the programmable logical blocks (PLB) carry out digital operations in electronic FPGAs or in configurable analogue blocks (CBAs), which carry out analogue operations in field-programmable analogue arrays (FPAA). Therefore, and in view of what is proposed below, it can be observed that the object of the invention allows one or various simultaneous photonic circuits and/or linear multiport transformations to be obtained by means of the specific programming of the resources and integrated components, that is to say, the Programmable Photonic Analogue Blocks, classical High-Performance Building Blocks (HPB) and Quantum High-performance Building Blocks (QHPB) and the selection of the ports used. Thus, the essential contribution of this invention is the architecture, workflow, technological layer stack, and technical description that enable the programming of the multipurpose interconnection schemes to perform quantum signal processing and quantum signal processing in parallel to classical signal processing. The object of the invention presents an architecture made up of a core connected to optical ports, high-performance processing Blocks and high-performance quantum processing Blocks, including at least three tiers that describe the architecture physically and from a software perspective. The core of the device can be implemented having different types of internal interconnection of equally-oriented programmable photonic analog blocks or tunable basic units and forming a pattern. Without this being a limiting example by means of a) a conventional hexagonal uniform distribution, b) by means of a proposed layout of equally-oriented units, c) conventional triangular uniform distribution, d) proposed layout of equally-oriented units, e) proposed layout of equally-oriented units and forming a non-uniform pattern.

The object of the invention is described in the set of claims, hereby included by reference.

Full quantum operation requires that the circuit is optically fed by a signal coming from a quantum source and which is detected in quantum signal detection elements. All in all, although these systems or circuits are able to perform the reconfigurable linear transformations required for quantum operations, they do not provide the required flexibility for the dynamic interconnection between the different subsystems or processing blocks required in the processor.

The photonic and quantum system, a quantum field-programmable photonic gate array of the present invention, brings a series of advantages inherent to field or real-time programming, expanded by the circuit topologies introduced by the invention. These include:

Shorter production times and time to market.

Shorter prototype development times and non-recurring associated costs.

Reduced financial risk in developing ideas and translating them into ASPICs.

Multifunctional and simultaneous or parallel operation circuits.

Circuit optimization.

Reduced manufacturing areas and refined single and common architecture.

Better yield and reproducibility of the programmable photonic analog blocks.

Larger number of alternative topologies not constrained by geometrical factors and fixed layouts.

The proposed chip (Q-FPPGA) of the present invention is suitable for the following applications:

Classical Applications:

Aerospace and Defense (Avionics, Communications, Secure Solutions, Space)

Automotive (High Resolution Video, Image Processing, Vehicle Networking and Connectivity)

Data Centers (Servers, Routers, Switches, Gateways)

High Performance Computing (Servers, Super Computers, SIGINT Systems, High-end RADARs, High-end Beam Forming Systems, Quantum computing, High-speed neural networks)

Integrated Circuit Design (ASPIC Prototyping, Hardware Emulation)

Wired and Wireless Communications (Optical Transport Networks, 5G Connectivity Interfaces, Mobile Backhaul)

Hardware accelerators.

Artificial intelligence, machine and deep learning applications.

Education kits.

DESCRIPTION OF THE DRAWINGS

In order to complement the description being made and with the object of helping to better understand the characteristics of the invention, in accordance with a preferred practical embodiment thereof, said description is accompanied, as an integral part thereof, by a set of figures where, in an illustrative and non-limiting manner, the following has been represented:

FIG. 3 shows a non-limitative classification of the different classical and quantum devices present in the Q-FPPGA architecture.

FIG. 6 shows in the left part a non-limitative example of the implementation of a quantum circuit with verification paths (in this case a CNOT gate).

PREFERRED EMBODIMENT OF THE INVENTION

Figure 1:
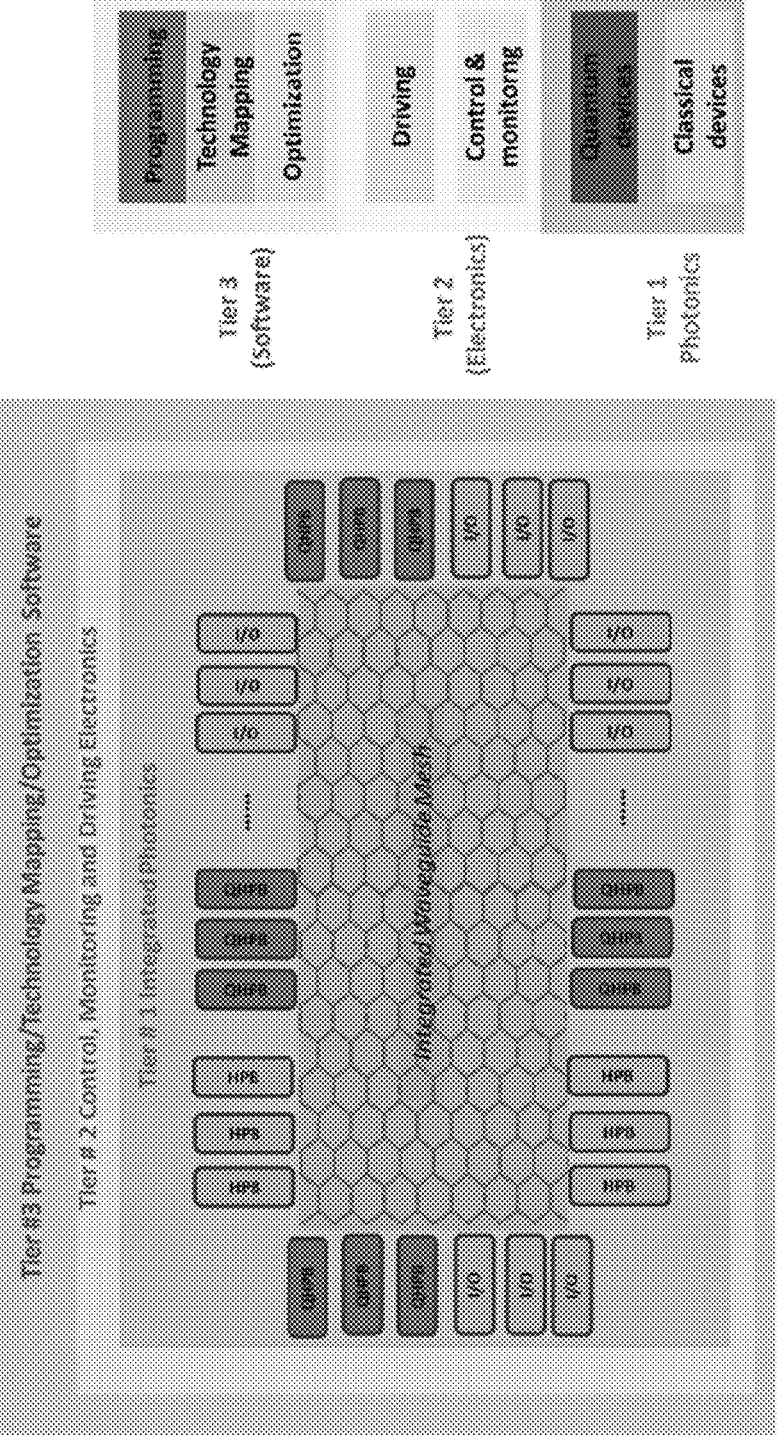
FIG. 1 shows a general scheme of the Q-FPPGA architecture and a detail of the three tiers that describe the architecture physically and from a software perspective.
Figure 2:
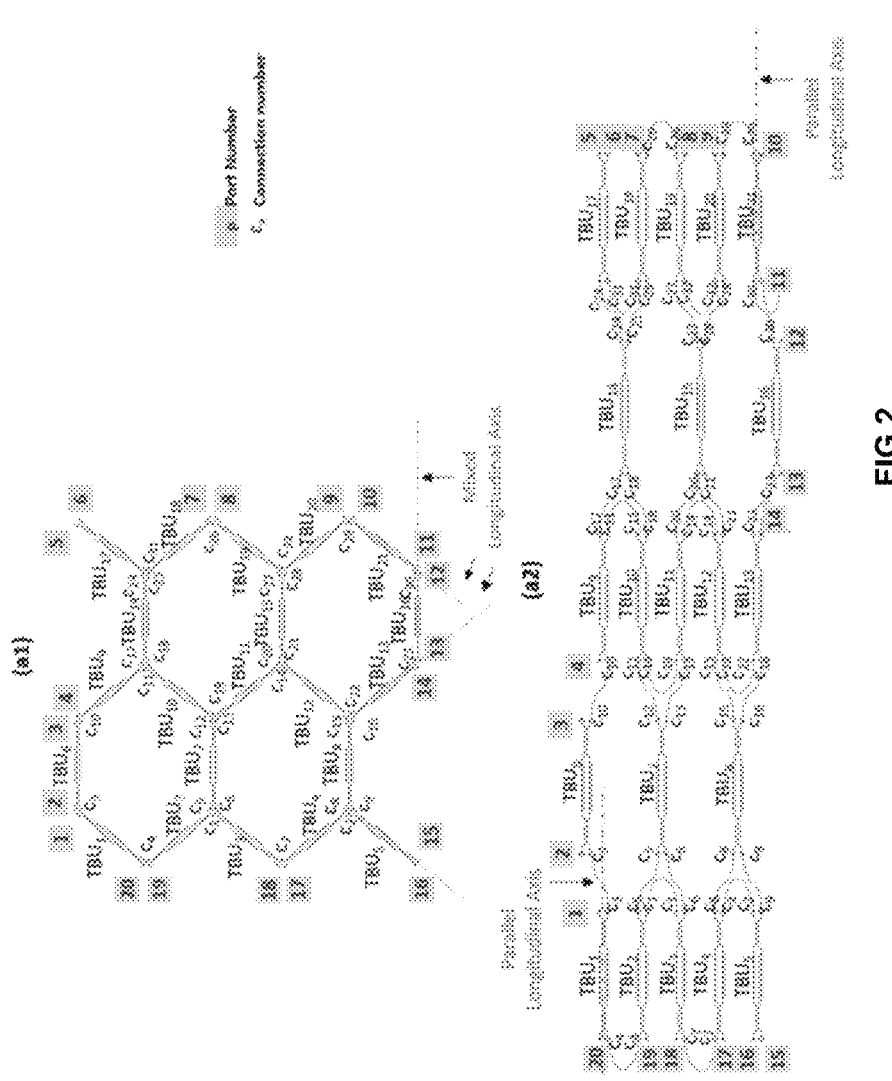
FIG. 2*a* shows non-limitative examples of a schematic diagram for the embodiment of the Q-FPPGA core, (a1): Conventional hexagonal uniform distribution, (a2): proposed equally-oriented unit layout.
FIG. 2*b* shows non-limitative examples of a schematic diagram for the embodiment of the Q-FPPGA core, (b1) Conventional square uniform distribution, (b2): proposed equally-oriented unit layout.
FIG. 2*c* shows non-limitative examples of a schematic diagram for the embodiment of the Q-FPPGA core, (c1): Conventional triangular uniform distribution, (c2): proposed equally-oriented unit layout.
FIGS. 2*d-e* show some non-limitative examples of a schematic diagram for the embodiment of the Q-FPPGA core with equally-oriented tunable basic units and following a non-uniform pattern.
Figure 2:
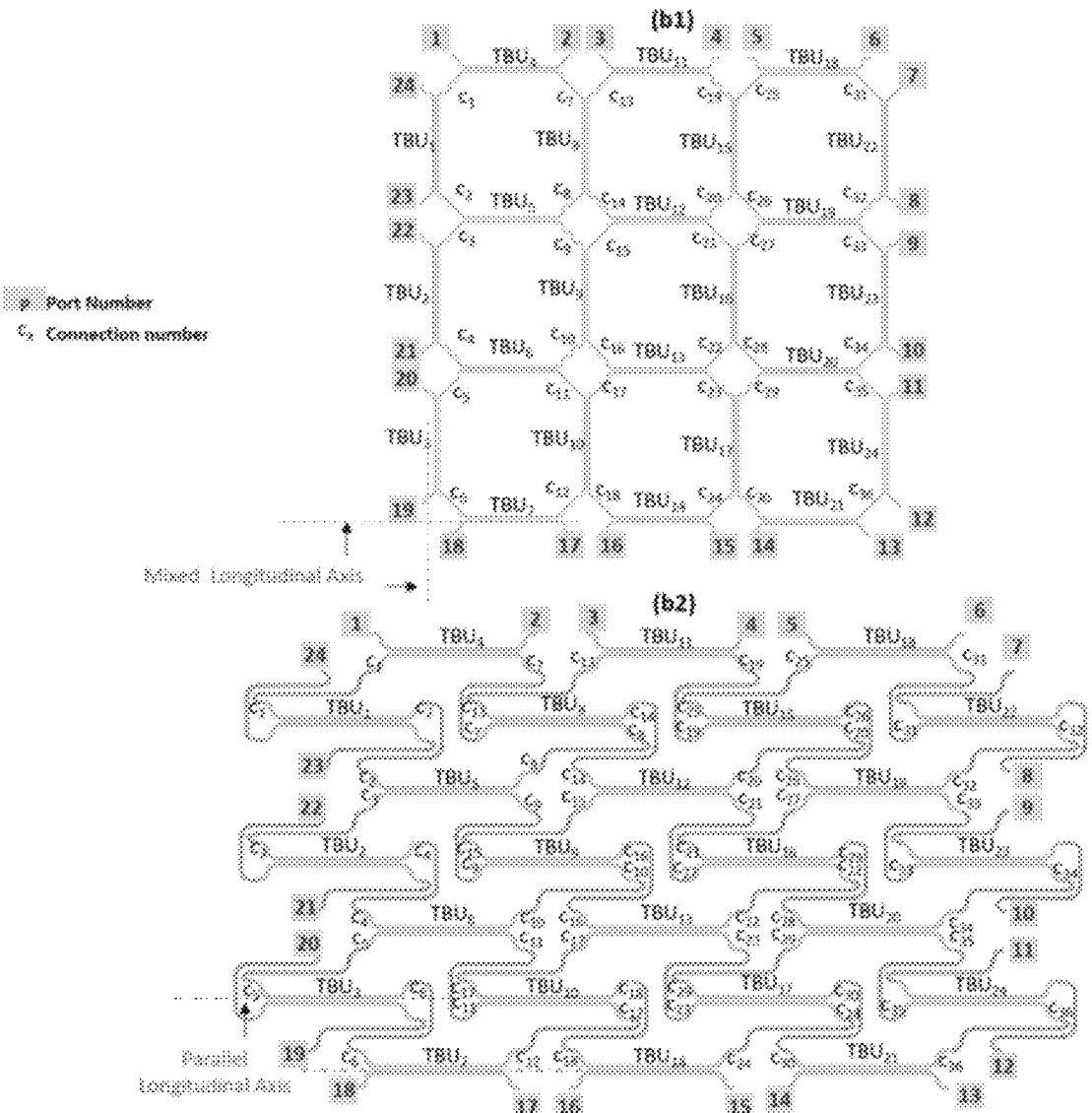
Figure 2:
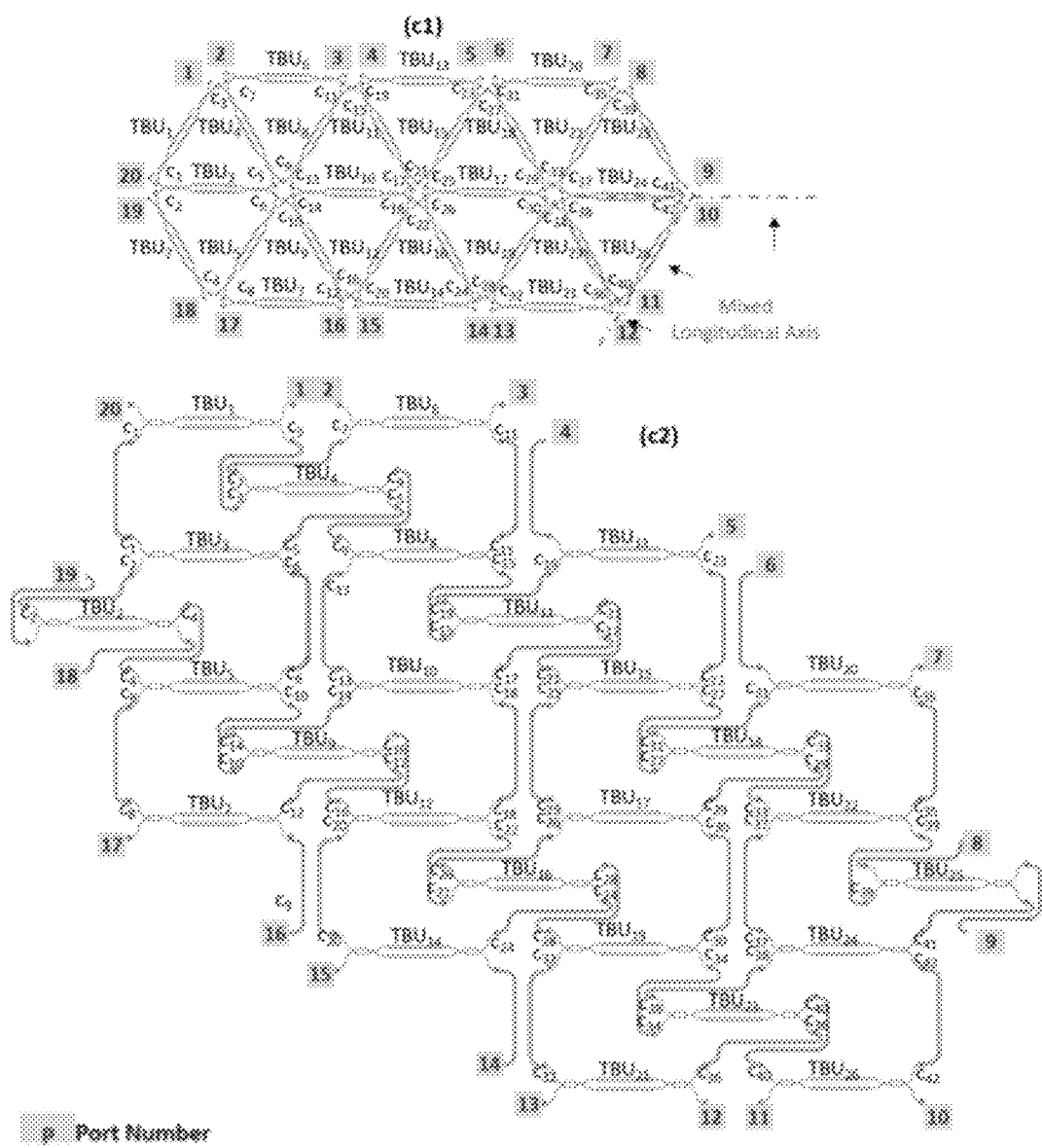
Figure 2:
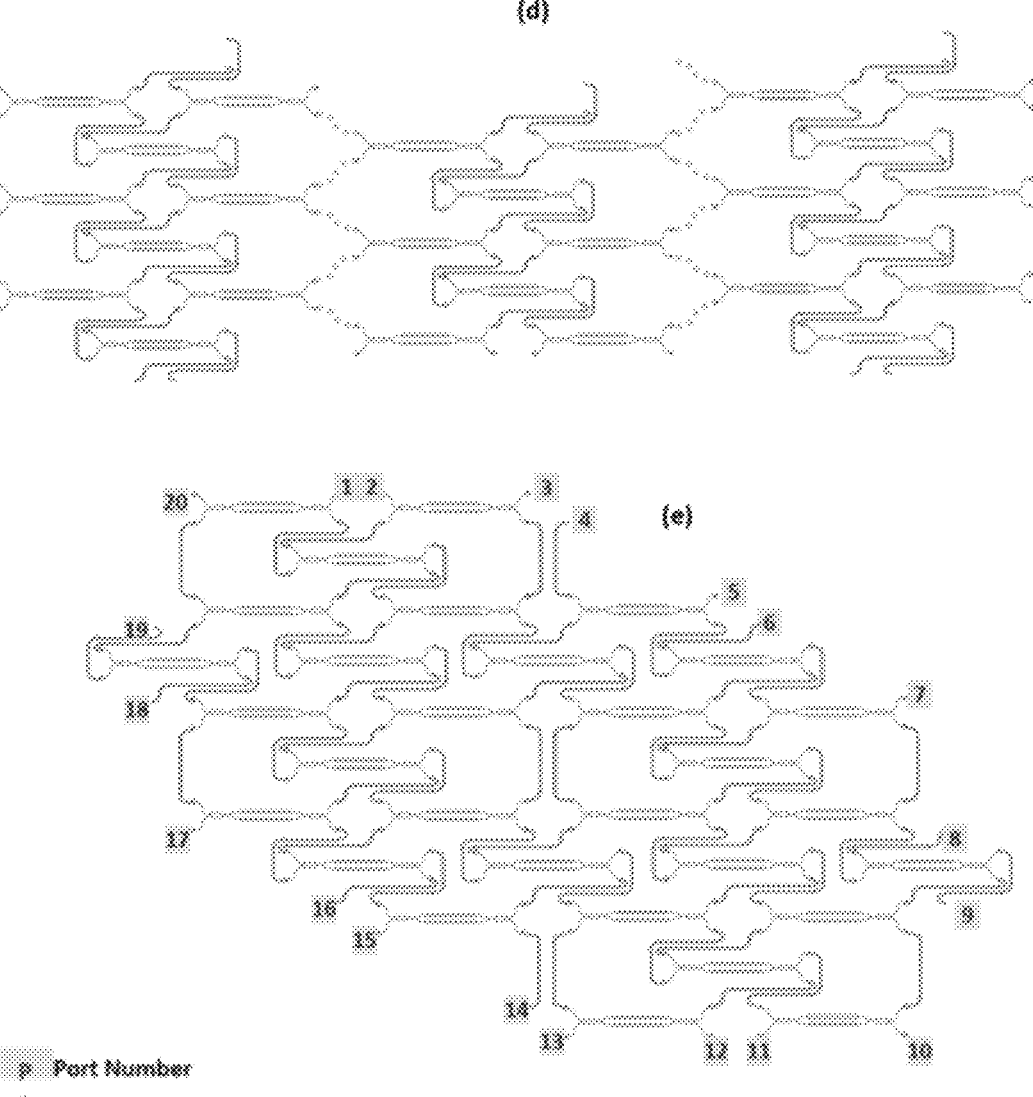

An exemplary embodiment of the invention according to the figures shown is described below. In FIG. 1, a Q-FPPGA is seen which comprises at least one, but preferably a large number of programmable photonic analogue blocks (PPAB) implemented by way of a series of waveguide elements integrated in a photonic circuit. These blocks have programmable characteristics and can propagate the optical signal in both directions. The design in FIG. 1 does not consider any particular interconnection topology for the Q-FPPGA core and that the resulting design shown there is only for the purposes of illustration. FIG. 2 illustrates different alternatives and interconnection geometries designed for the implementation of the Q-FPPGA core. Although various configurations for implementing the PPAB may be considered, here we are illustrating the design with very basic 4-port units, as described in U.S. Ser. No. 16/235,056, JP 2018-247546, P201930410, P201831118, hereby included by reference. The function of the PPAB is to provide independent tunable power coupling relations and adjustable phase response configuration, as explained below. Overall, the waveguide mesh performs dynamic routing or switching between the different Q-FPPGA ports and areas and between the classical and quantum high-performance building blocks.

Figure 3:
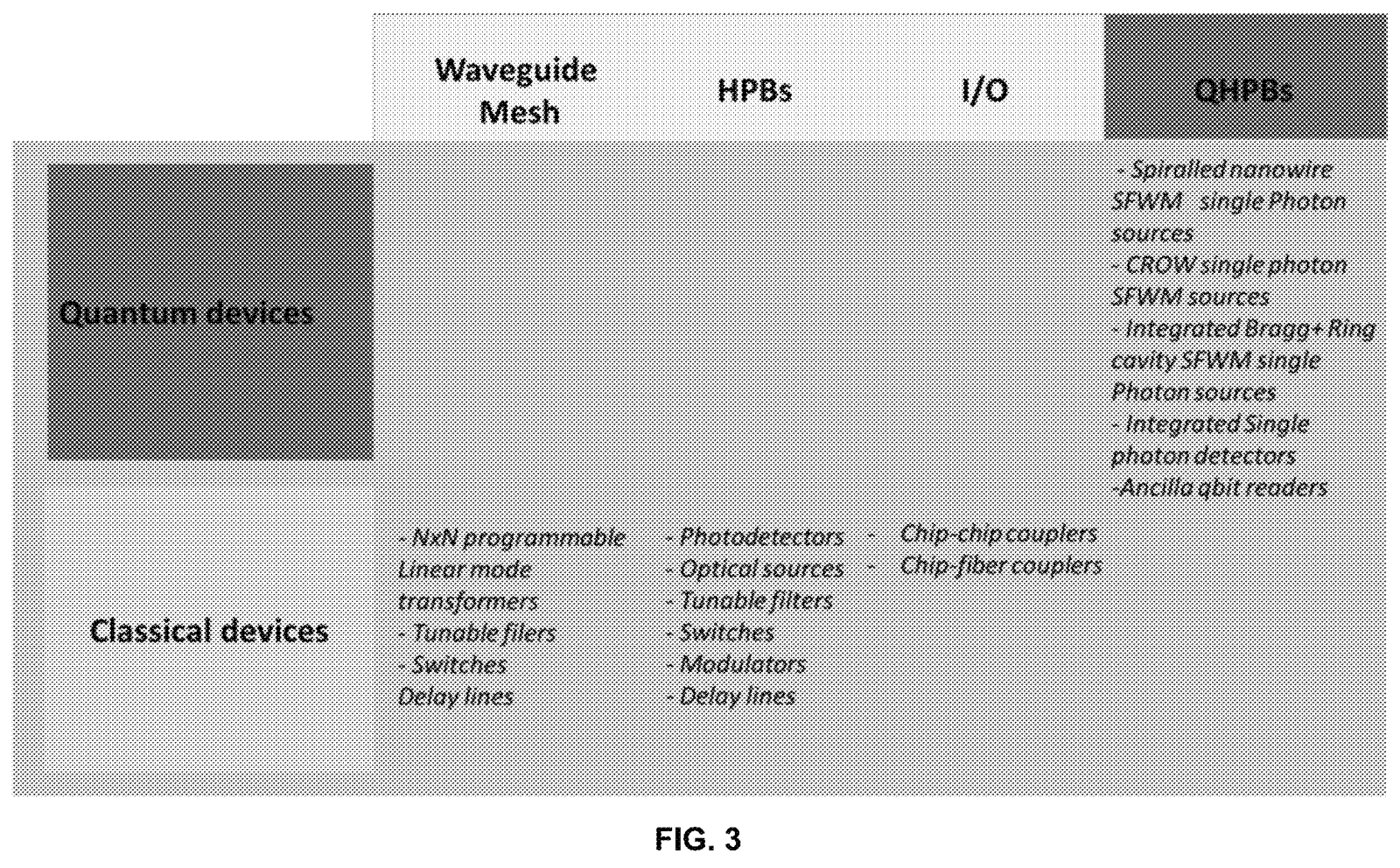

Similar to modern FPGA families, Q-FPPGA can include classical and quantum high-performance processing blocks (HPB, QHPB) to expand its capabilities and include higher-level functionality connected to the chip core. This is shown schematically in the right part of FIG. 1. Having these functions and high-level blocks embedded into the chip reduces the area required for those functions compared to its implementation via basic blocks of the core. Moreover, some of the functions cannot be divided and programmed by using the core exclusively. Examples of these processing blocks include highly dispersive elements, spiral delay lines, generic modulation and photo detection subsystems, optical amplifiers and optical source subsystems and high-performance filtering structures to cite a few. A special case of HPB comprises an element interconnected to the optical core, which comprises a multiplexed and demultiplexed subsystem, either of which can be spectrally cyclic or non-cyclic, enabling the processing on different spatial channels/modes as well as different spectral channels/modes. However, the main technical advance comes from the interconnection of Quantum HPBs. These provide quantum functionalities that can be divided, distributed and programmed efficiently within the Q-FPPGA core, in addition to being combined with HPBs and QHPBs, as quantum sources, detectors, processing signals, and ancilla detectors, to cite a few. FIG. 3 provides a non-limiting example of components present in the Q-FPPGA.

The PPABs are 2×2 photonic blocks or components capable of independently configuring a common phase shift $\Delta_{PPAB}$ and optical power splitting ratio $K=\sin \square$ $(0<=K<=1)$ between its waveguide input and output access fields.

Figure 5:
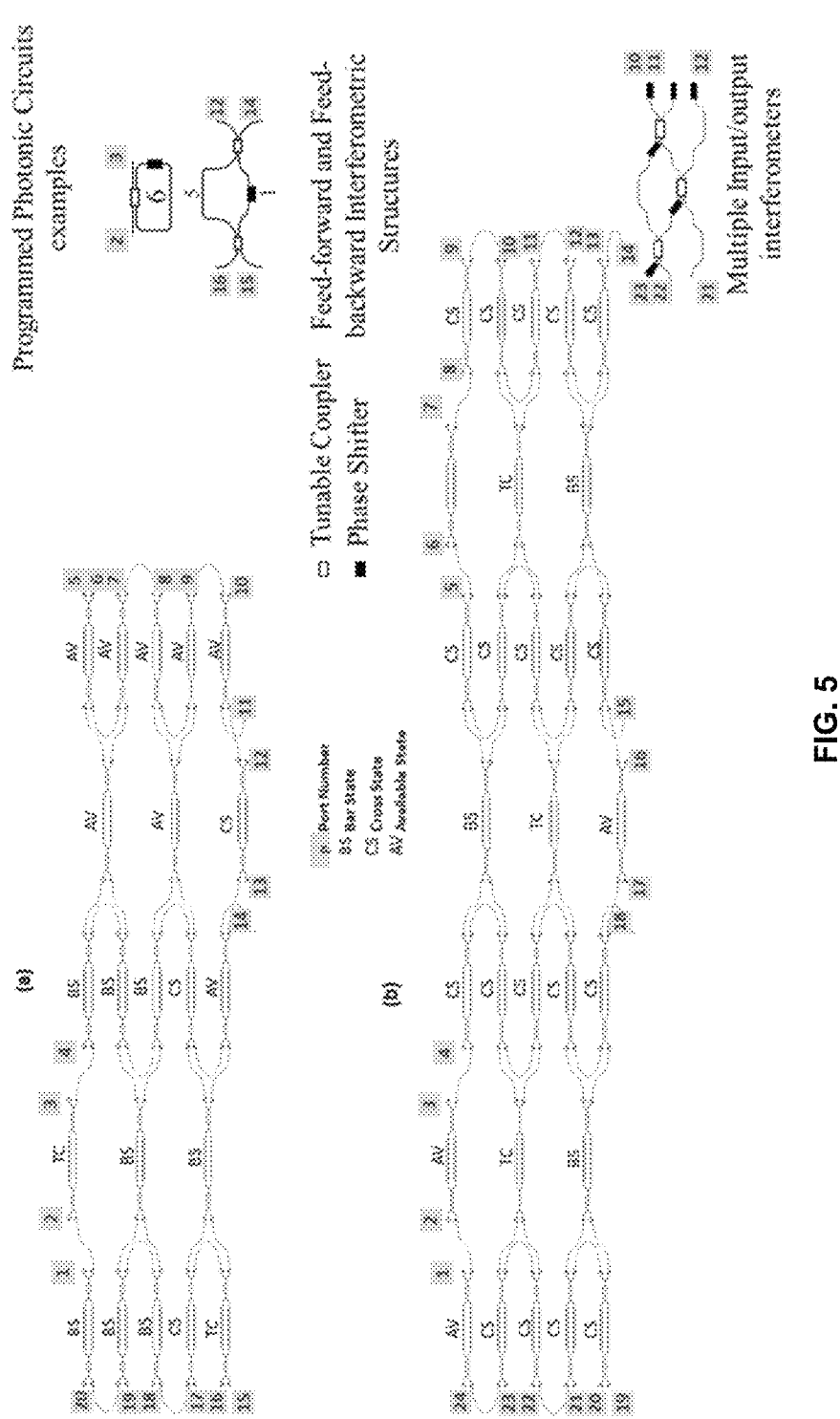
FIG. 5 shows the simultaneous implementation of a classical ring cavity circuit, a Mach-Zehnder Interferometer and a 3×3 multiple port device using a reconfigurable Q-FPPGA core of the chip of the present invention.

By means of the specific programming and the concatenation of processing blocks, the Q-FPPQA can implement complex autonomous and/or parallel circuits, signal processing transformations and quantum processing operations by splitting conventional optical processing circuits into reconfigurable photonic interconnects (RPIs) and PPAB units and through the use of high-performance processing blocks. In particular, the concept of programming the Q-FPPGA core is illustrated by means of three generic designs, which are represented in FIGS. 5, respectively. FIG. 5(a) shows how the configuration of each processing block leads to the programming of two optical filters based on a ring resonator and a Mach-Zehnder Interferometer. FIG. 5(b) shows the programming of a Q-FPPGA core to obtain a multiport interferometer.

The quantum field-programmable photonic gate array (Q-FPPA) according to the invention is an array of uncommitted elements that can be interconnected according to the user's specifications configured for a wide variety of classical and quantum applications. The Q-FPPGA combines the programmability of the most basic reconfigurable photonic integrated circuits and quantum processing components in a scalable interconnection structure, allowing dynamic programmable circuits a with much higher processing density. Thus, programming complex circuits comes from the interconnectivity. Our proposed invention solves some of the problems associated with quantum circuits. Quantum and classical circuits are programmed employing shared resources integrated in the chip, leading to advantages inherent to direct (or field) programmable hardware approaches: shorter times for producing, developing and taking a solution to market, shorter prototype development times and non-recurring engineering costs, reduced financial risk in developing ideas and translating them into ASPICs, multifunctional and multitask operation, circuit optimization, better yield and reproducibility of the PPABs. Compared to the FPPAs or reconfigurable photonic circuits, the present invention incorporates dynamic quantum signal processing thanks to the aggregation of high-performance processing blocks and the design of the workflow and architecture.

Figure 4:
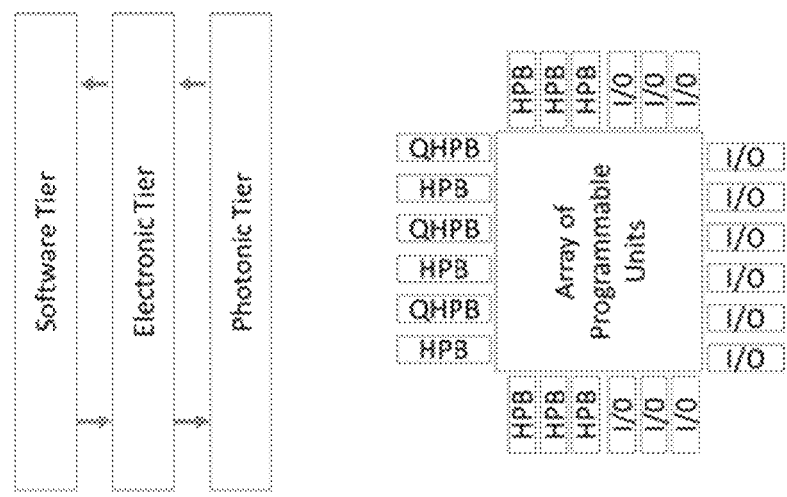
FIG. 4 (left) shows the main steps involved in the design/configuration flow of the integrated photonic and quantum system of the present invention, and (right) the soft and hard tiers of the photonic circuit and expanded layout including peripheral high-performance elements.
Figure 4:
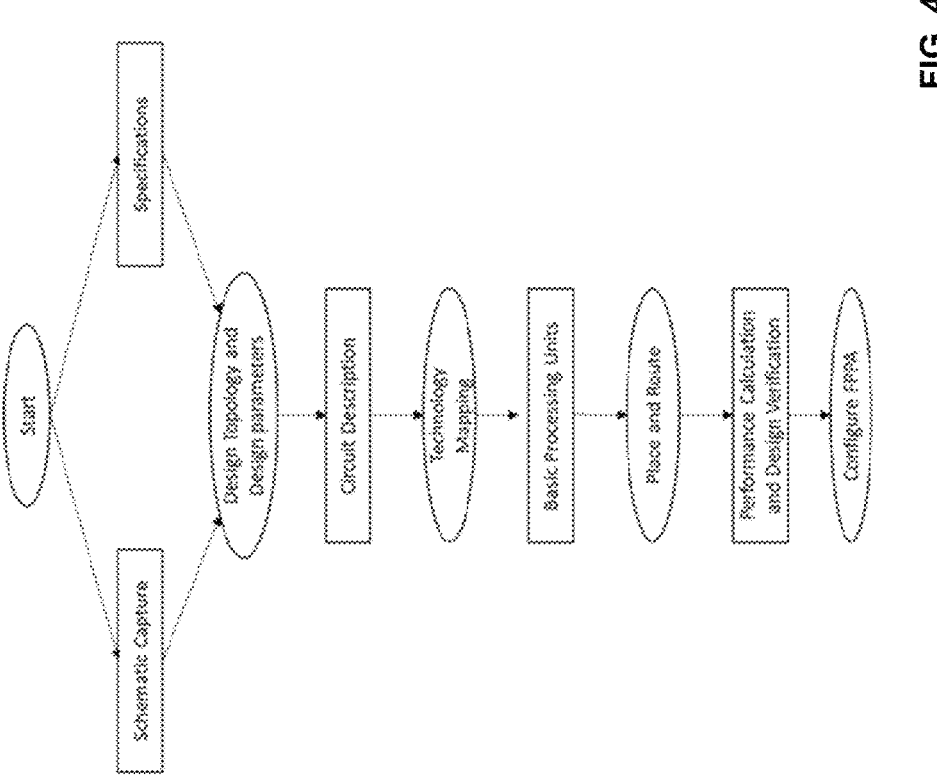

The left part of FIG. 4 shows the main steps of the design flow process, which is now described. Similar to the photonic FPPA, the starting point for the design flow is the entry of the application to be implemented. In this case they can be both classical and/or quantum applications. The specifications are then processed by an optimization procedure to enhance the area used and the performance of the final circuit. Then, specifications are transformed into a compatible circuit with the elements included in the Q-FPPGA (technology mapping process), optimizing attributes such as delay, performance or the number of elements used.

The technology mapping phase transforms the optimized network into a circuit that consists of a restricted set of Q-FPPGA elements. This is done by selecting components and parts of the network that can each be implemented by the elements available in the Q-FPPGA, and then specifying how these elements will be interconnected. This will determine the total number of processing components required for the targeted implementation.

Then, a decision about the placement of the different parts of the circuit follows, assigning each one to a specific location in the Q-FPPGA. At that moment, the global routing is responsible for choosing the processing elements that will operate as access paths. In contrast to an electronic FPGA, this structure does not physically differentiate between the processing elements and interconnection elements. Subsequently, the processing elements are configured correspondingly and performance is calculated and the design is verified. This process can be done either physically by feeding all the necessary configuration data to the programming units to configure the final chip or by employing accurate models of the Q-FPPGA. At each step, it is possible to run an optimization process that might decide to reconfigure any of the previous steps.

From the aforementioned description, it can be appreciated that the Q-FPPGA involves not only the physical photonic and electronic control hardware, but it also includes a software layer (see upper right part of FIG. 1 and FIG. 4).

The steps contained in the design flow can be done automatically by the software layer, by the user, or by a mixture of the two, depending on the autonomy and the capabilities of the Q-FPPGA. In addition, a failure in any of the preceding steps will require an iterative process until the specifications are successfully met. A parallel optimization process provides a robust operation, in addition to the capacity to tolerate malfunctions and manufacturing defects and increasing the processing capacities of the physical device.

In addition, the Q-FPPGA can incorporate multiple and independent cores that can be interconnected to each other and to high-performance processing blocks to increase their processing capacity. These waveguide cores can be integrated in the same substrate or in different chips.

OPERATION EXAMPLES

FIGS. 6 to 10 provide some examples where different types of Q-FPPGA of are programmed to emulate and implement simultaneously different quantum photonic circuits. The examples are representative of the capabilities and do not intend to be exhaustive. They rather show simple configurations, which can be extended to more complex circuits. In these layouts, only the relevant components such as I/O ports, HPBs and QHPBs are shown. In each case, the figure includes the Q-FPPGA layout with highlighted operating PPABs in the waveguide core and the layouts of the different implemented circuits.

Figure 6:
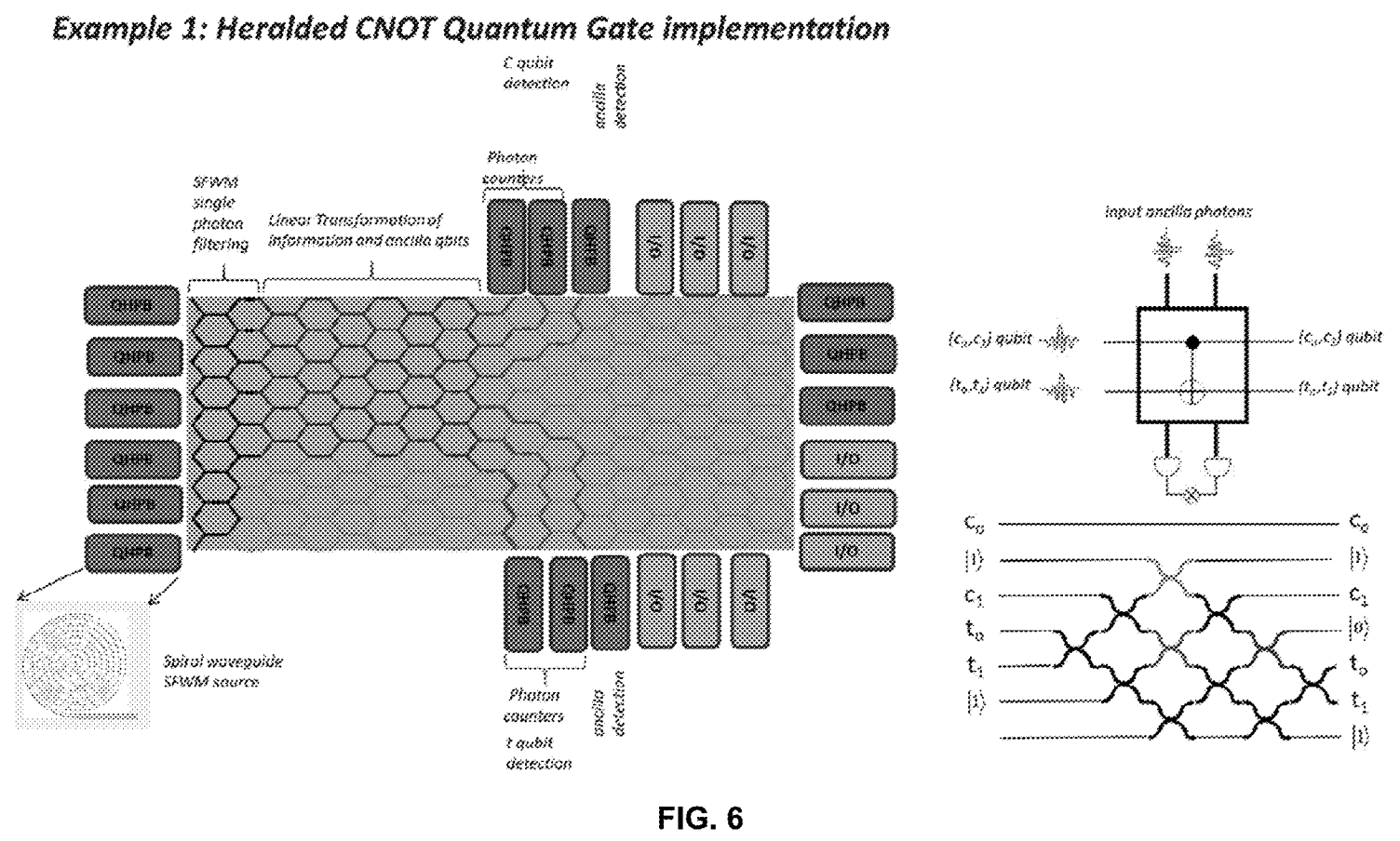

FIG. 6 represents an operation case where the Q-FPPGA is programmed to implement quantum gates. The case illustrated here corresponds to a C-NOT gate with a layout shown in the right part of the figure), where the input state and the heralded photons are generated by QHPBs that generate photon pairs via non-linear effects such as Spontaneous Four-Wave Mixing (SFWM) and the output state and the heralded photons are detected by means of specific QHPB blocks that implement photon counters. The programmable mesh waveguides implement two tasks, the filtering of one of the two photons generated by SWFM and the linear unitary transformation that implements the CNOT gate. The QHPBs should ideally be on the same chip, but they can be located externally, in the Q-FPPGA by means of hybrid or heterogeneous integration. Note that the unused HPB blocks and the input and output ports of the Q-FPPGA not employed in this case are not shown for simplicity. Moreover, more complex circuits can be implemented by extending the shown concept and using a greater percentage of resources, components and mesh portion, as well as extra QHPBs implementing additional sources and detectors.

Figure 7:
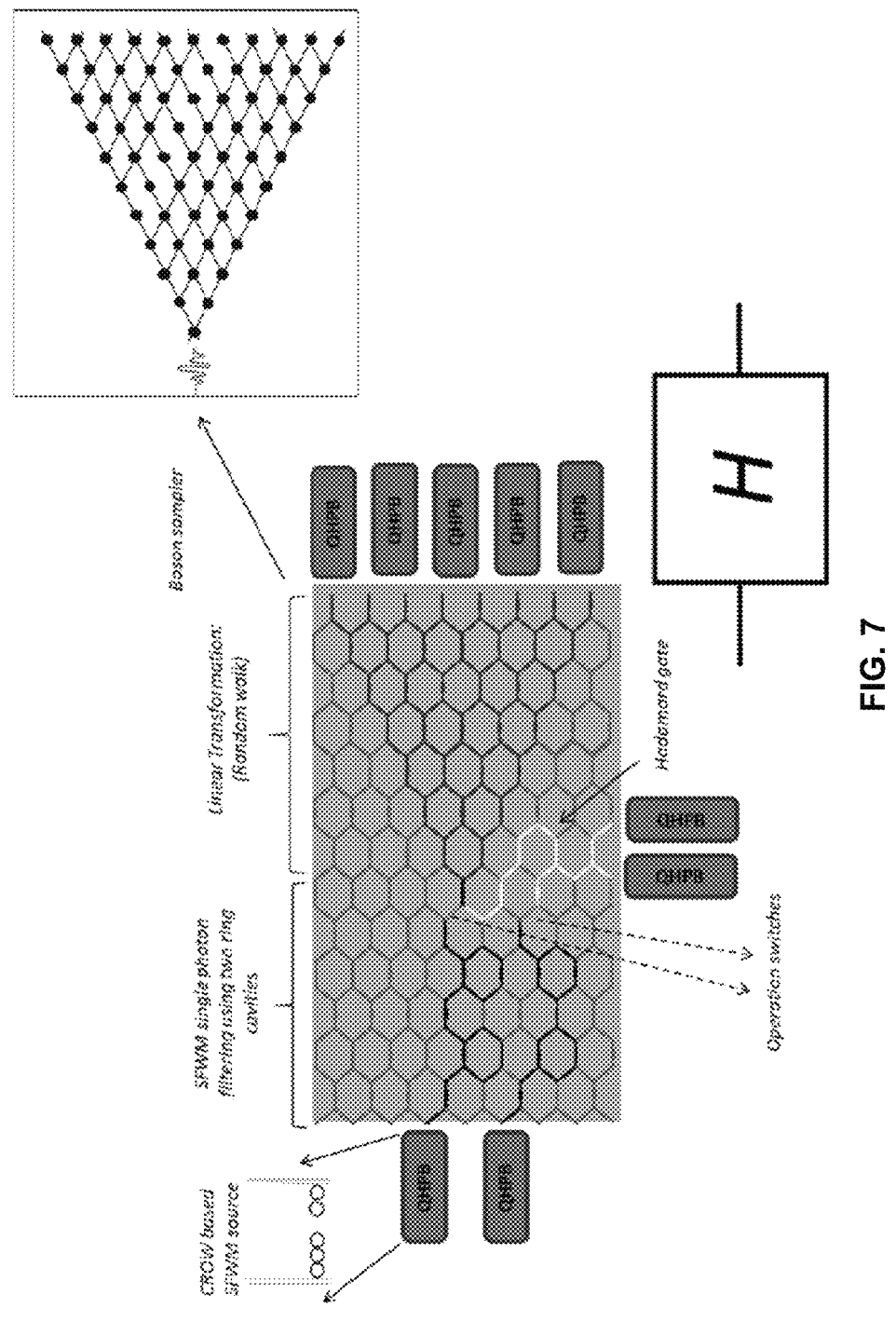
FIG. 7 shows a non-limitative example of the implementation of a switched or simultaneous resource-shared set of programmable quantum circuits.

FIG. 7 illustrates the operation in switched mode. Here two or more circuits are programmed over the available sources in the Q-FPPGA that shares common QHPBs in this case and specifically the independent photon sources. The example shows a triangular boson sampler and a Hadamard gate, the implementation of which is shown in the upper right part and lower right part, respectively. Both circuits share QHPBs that generate photon pairs via SFWM, as well as a common part of the core formed by the waveguide mesh to implement the corresponding linear transformations thereof. Switching is performed by tuning the Programmable Photonic Analog Blocks (PPAB) inside the waveguide mesh to select the operation of one or another circuit. Photon detection is performed in this example by unshared QBPBs.

Figure 8:
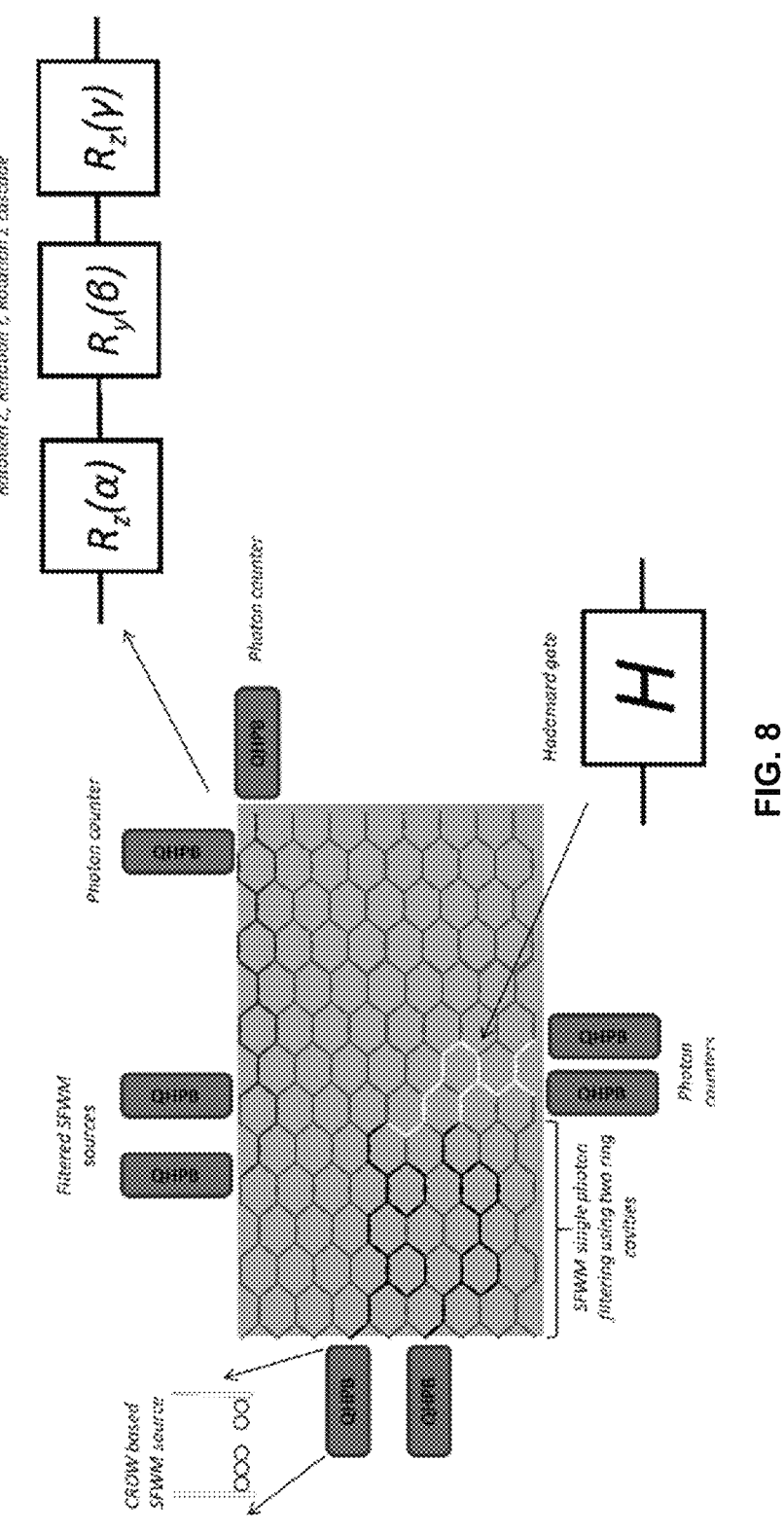
FIG. 8 shows a non-limitative example of the simultaneous implementation of an independent set of quantum circuits. Each circuit uses its own resources.

FIG. 8 illustrates the operation in shared mode where two or more circuits are simultaneously configured over the physical device defined by the waveguide mesh and the peripheral blocks. In this specific case, QHPBs are employed for the preparation and detection of the input and output signals, respectively, and different sections of the waveguide mesh are used to implement the required photon filtering and linear unitary transformations. The two circuits are in this case a Hadamard gate and a cascade of gates corresponding to the X, Y, and Z rotation transformations. The QHPB implementing the initial state of the Hadamard gate are photon pair sources requiring post filtering, while those implementing the initial state of the rotation cascade matrices are single photon sources.

Figure 9:
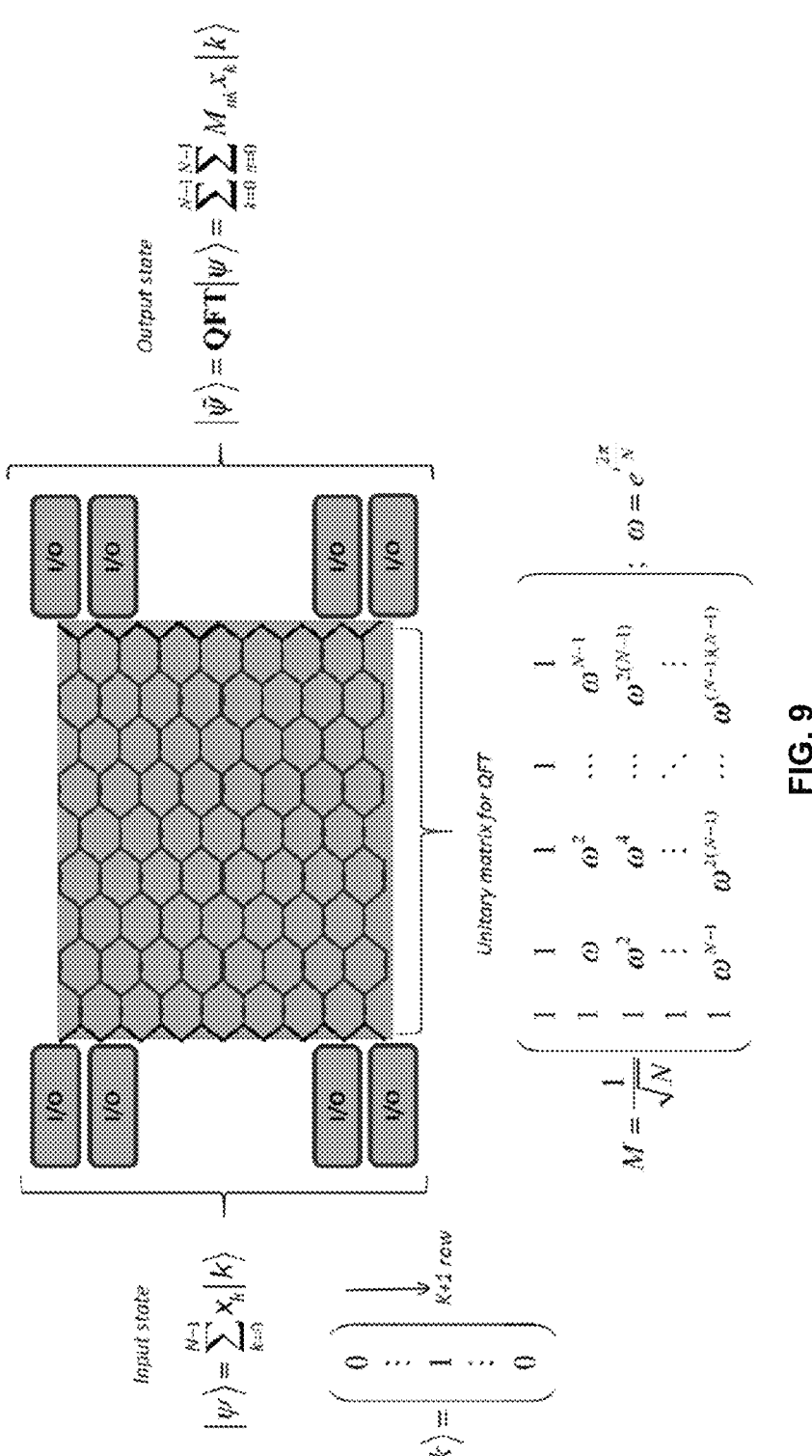
FIG. 9 shows a non-limitative example of a programmable quantum circuit corresponding to a Quantum Fourier Transform.
Figure 10:
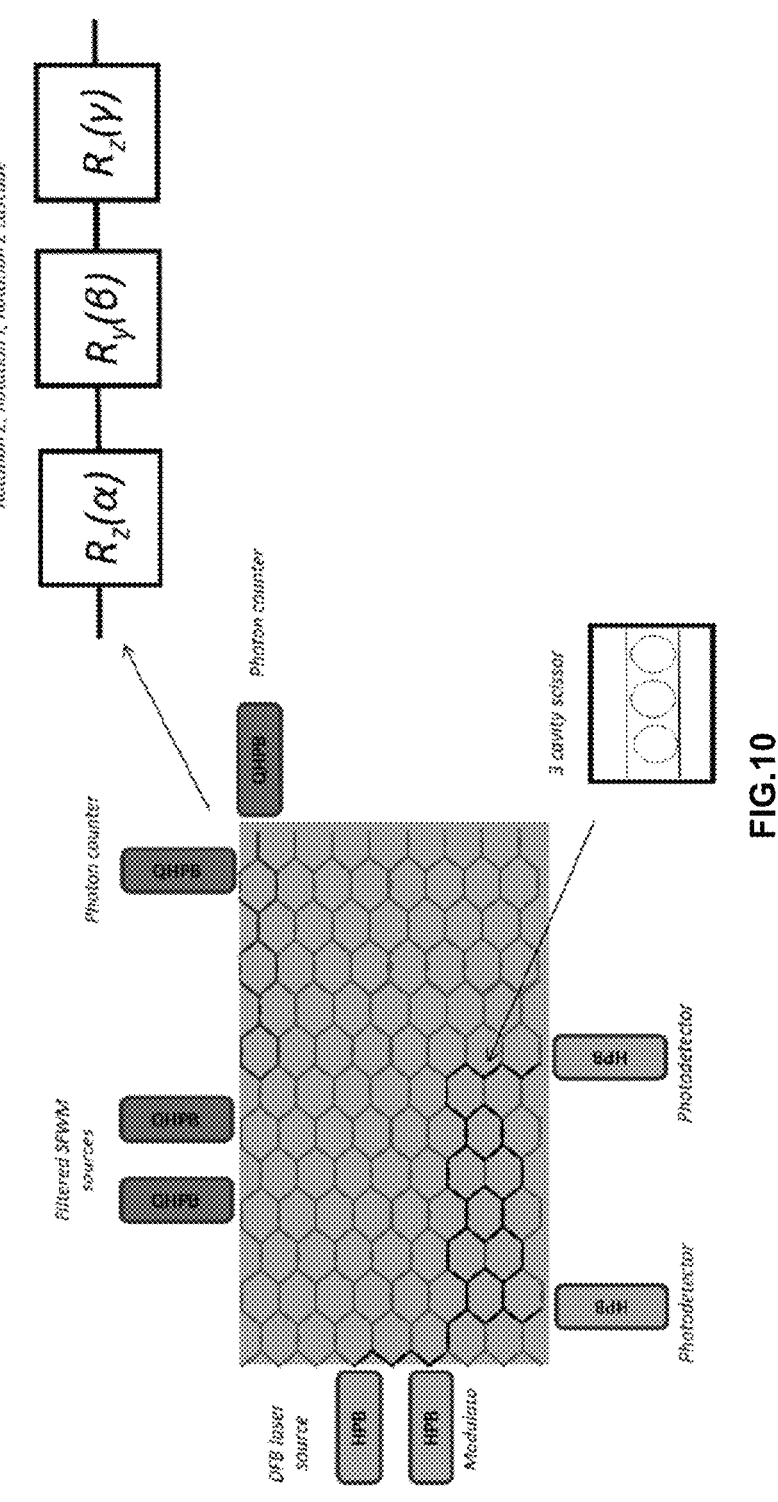
FIG. 10 (left) shows an example of simultaneous configuration of quantum and classical circuits, and (right) the layouts of the implemented circuits.

FIG. 9 illustrates the case where a state or quantum mode (of dimension N) is entered into the input to the QFPGA by means of one of the I/O ports. Here the QFPGA is programmed to carry out a simple linear transformation and no additional QHPBs are used unless the final state needs to be measured. For instance, the example in FIG. 9 represents the implementation of a Quantum Fourier Transform operation. Finally, FIG. 10 shows an example of a mixed classical and quantum signal operation. Here part of the core formed by the waveguide mesh implements a quantum gate (rotation array cascade), while another part implements a classical coupled-cavity filter (CROW) to process the classical signal generated by using the two HPBs that consist of an integrated DBF laser and an external modulator.

PHYSICAL IMPLEMENTATION

The physical implementation of the Q-FPPGA device calls for an integrated optics approach either based on silicon photonics technology or other materials of group IV or by means of hybrid/heterogeneous combinations together with other materials such as those from group III-V.

As for the PPAB elements, the currently available integrated photonics technology options allow for the integration of phase tuning elements like: MEMS, thermo-optic effects, opto-mechanic effects, electro-capacitive effects, phase change materials or non-volatile actuators. These phase actuators are integrated in any interferometric or non-interferometric, resonator or non-resonator structures with more than two ports. Finally, as mentioned before, more complex Q-FPPGA layouts can be designed by setting different block interconnections schemes. Some examples are shown in FIG. 2.

As described in FIG. 1, the physical device (hardware) corresponding to the integrated optical circuit requires the system integration with control electronics to perform the programming tasks of the opto-electronic actuators and to perform tasks and global optimizations of the circuit.

The invention claimed is:

1. A quantum field-programmable photonic gate array configured to carry out a targeted implementation comprising:

a reconfigurable quantum field-programmable photonic gate array core, and a quantum high-performance building block, wherein the reconfigurable quantum field-programmable photonic gate array core and the quantum high-performance building block are physically the same;

wherein the quantum high-performance building block is connected to the reconfigurable quantum field-programmable photonic gate array core; and wherein the quantum high-performance building block and the reconfigurable quantum field-programmable photonic gate array core are restricted to a number of processing components required for carrying out the targeted implementation and assigned to a specific location in the quantum field-programmable photonic gate array.

2. The quantum field-programmable photonic gate array of claim 1, wherein the quantum field programmable photonic gate array further comprises at least one optical port and/or at least one high-performance building block connected to the reconfigurable quantum field-programmable photonic gate array core.

3. The quantum field-programmable photonic gate array of claim 2, wherein the at least one high-performance building block is one selected from highly dispersive elements, waveguide delay lines, generic modulation elements and photo detection subsystems, optical amplifiers and source subsystems and high-performance filtering structures, multiplexers and demultiplexers.

4. The quantum field-programmable photonic gate array of claim 2, wherein the at least a quantum high-performance building block is one selected from quantum sources, processing units, and detectors.

5. The quantum field-programmable photonic gate array of claim 2, further comprising multiple and independent processing cores interconnected to each other and to the high-performance building blocks.

6. The quantum field-programmable photonic gate array of claim 1, wherein the quantum field programmable photonic gate array further comprises at least one programmable photonic analogue block implemented by way of a series of photonic waveguide elements integrated in a photonic chip.

7. The quantum field-programmable photonic gate array of claim 6, comprising at least two interconnected programmable photonic analogue blocks that are equally-oriented and are disposed following a uniform pattern.

8. The quantum field-programmable photonic gate array of claim 7, wherein the uniform distribution pattern is one selected from a hexagonal uniform waveguide mesh distribution, a square uniform waveguide mesh distribution and a triangular uniform waveguide mesh distribution.

9. The quantum field-programmable photonic gate array of claim 6 comprising at least two interconnected programmable photonic analogue blocks that are equally-oriented and are disposed following a non-uniform pattern.

10. An integrated photonic and quantum device implemented via a photonic circuit integrated in a chip substrate comprising:

a physical layer comprising the at least a quantum field-programmable photonic gate array of claim 1;

a control electronic layer; and a software layer.

11. A programmable quantum circuit comprising the integrated photonic and quantum device of claim 10.

12. The programmable quantum circuit of claim 11, wherein the circuit is based on a ring resonator or a Mach-Zehnder interferometer.

13. A method of design of the programmable quantum circuit of claim 11 comprising the following steps:

election of an initial application to be implemented;

processing of an area or performance of the programmable quantum circuit;

mapping and transfer of the application into a compatible circuit of quantum field-programmable photonic gate array processing blocks.

14. The method of claim 13 wherein the step of mapping and transfer of the application into a compatible circuit of quantum field-programmable photonic gate array processing blocks further comprises:

a first selection step wherein parts of the circuit are implemented by circuit elements;

an interconnection step wherein the circuit elements are connected, an assignation step wherein each processing block is assigned to a specific location in the quantum field-programmable photonic gate array, a second selection step wherein processing blocks that operate as access lightpaths are selected.

15. The method of claim 14 further comprising:

a circuit performance calculation and design verification step.

16. The method of claim 15 wherein the circuit performance calculation and design verification step is carried out physically by feeding all the necessary configuration data to the programming units to configure the chip or by employing accurate models of the quantum field-programmable photonic gate array.

17. The method of claim 13 wherein the steps are carried out automatically by the software layer, by the user, or a mixture of the two, depending on the autonomy and the capabilities of the quantum field-programmable photonic gate array.

18. The quantum field-programmable photonic gate array of claim 1 further comprising at least an additional quantum high-performance building block or at least a first high-performance building block;

wherein the interconnection between the at least a quantum high-performance building block and the at least an additional quantum high-performance building block or the at least a first high-performance building block is modifiable.

19. The quantum field-programmable photonic gate array of claim 1 further comprising at least an additional quantum high-performance building block or at least a first high-performance building block;

wherein the reconfigurable quantum field-programmable photonic gate array core assigns a specific location between the at least a quantum high-performance building block and the at least an additional quantum high-performance building block or the at least a first high-performance building block.

* * * * *